United States Patent
Chen et al.

(10) Patent No.: US 8,536,913 B2
(45) Date of Patent: Sep. 17, 2013

(54) TRANSITION TIME LOCK LOOP WITH REFERENCE ON REQUEST

(75) Inventors: Wilson J. Chen, San Diego, CA (US); Chiew-Guan Tan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/368,956

(22) Filed: Feb. 8, 2012

(65) Prior Publication Data

US 2013/0187692 A1 Jul. 25, 2013

Related U.S. Application Data

(60) Provisional application No. 61/588,717, filed on Jan. 20, 2012.

(51) Int. Cl.
*H03L 7/06* (2006.01)

(52) U.S. Cl.
USPC .......................................... 327/157; 375/374

(58) Field of Classification Search
USPC .................. 327/156–157, 162, 172–176, 170, 327/146–149, 155, 31, 33, 35, 38, 108–112; 331/17, 18; 375/373–376; 323/283
See application file for complete search history.

(56) References Cited

U.S. PATENT DOCUMENTS

| 4,972,101 A | 11/1990 | Partovi et al. |
| 5,889,829 A * | 3/1999 | Chiao et al. .................. 375/376 |
| 7,109,768 B2 * | 9/2006 | Rashid .......................... 327/170 |
| 7,663,418 B2 * | 2/2010 | Dale et al. ..................... 327/170 |
| 2003/0179029 A1 | 9/2003 | Eichfeld et al. |
| 2005/0285647 A1 | 12/2005 | Wilson et al. |
| 2007/0001725 A1 | 1/2007 | Atha et al. |
| 2008/0164924 A1 | 7/2008 | Bucossi et al. |

OTHER PUBLICATIONS

International Search Report and Written Opinion—PCT/US2013/022344—ISA/EPO—May 24, 2013.

* cited by examiner

*Primary Examiner* — Lincoln Donovan
*Assistant Examiner* — Thomas Skibinski
(74) *Attorney, Agent, or Firm* — Sam Talpalatsky; Nicholas J. Pauley; Joseph Agusta

(57) ABSTRACT

Output driver feedback circuitry limits output slew rates across a wide range of output loads. A transition time lock loop architecture of the feedback circuitry compares a transition time pulse with a reference pulse to adjusts transition time of an output signal for various process-voltage-temperature (PVT) process corners, output voltage domains and output capacitances. Reference pulse generation circuitry provides a reference pulse in phase with the transition time pulse for each rise and fall of the output signal.

14 Claims, 9 Drawing Sheets

TRANSITION TIME LOCK LOOP WITH REFERENCE ON REQUEST

CROSS REFERENCE TO RELATED APPLICATION

The present application claims the benefit of U.S. Provisional Patent Application No. 61/588,717 to Chen et al. filed on Jan. 20, 2012.

TECHNICAL FIELD

The present disclosure relates generally to semiconductor output driver circuitry. More specifically, the present disclosure relates to controlling the transition time of an output from semiconductor output driver circuitry.

BACKGROUND

Integrated circuit design specifications generally include limits for the transition times and slew rates of output signals. For example, recent Mobile Industry Processor Interface (MIPI) input/output (I/O) interface standards, such as Serial Low-power Inter-chip Media Bus (SLIMBus), have called for limited output slew rates across a very wide range of output loads (e.g., 15 pF-75 pF) and across process, voltage and temperature (PVT) variations. Such standards also call for multiple output voltage modes.

Variations in the load capacitance coupled to output circuitry on an integrated circuit chip affect the slew rates and transition times of the output signals. Output interface circuitry on a chip may include capacitive feedback, which compensates for some variations in load capacitance but may not be capable of meeting tight transition time specifications. For interfaces that are designed to provide a limited output slew rate across a very wide range of output capacitive loads, general purpose input/output (GPIO) circuitry may not be able to provide output signals that satisfy the transition time requirements, even if such circuitry includes output drivers with capacitive feedback.

Because of the continued rapid scaling of complementary metal oxide semiconductor (CMOS) technology, the use of off-chip components is becoming more expensive. Compensation techniques that involve off-chip calibration are therefore increasingly expensive to implement. Thus, the use of off-chip components is generally limited to applications that rely on highly accurate delay calibration. Even presently known off-chip calibration techniques may not be effective to compensate for very wide variations in output load capacitance.

SUMMARY

Aspects of the present disclosure include feedback circuitry configured to provide limited output slew rates across a wide range of output loads. The feedback circuitry locks output transition time regardless of the PVT process corner, the output voltage domain or the output capacitance. The feedback circuit may provide sufficient adjustment of the output driver within a single cycle in which the output capacitance is not expected to change much over time.

An output driver time lock loop apparatus, according to an aspect of the present disclosure, includes output driver circuitry coupled between a first output Bode and a second output node and feedback circuitry coupled to the output driver circuitry. The feedback circuitry is configured to generate a first analog bias voltage in response to a signal on the second output node. The output driver circuitry includes a first current source biased by the first analog bias voltage.

A method for locking output transition timing of interface circuitry, according to an aspect of the present disclosure, includes generating a first transition time pulse having a pulse width equal to a characteristic of an output driver output and generating a reference pulse having pulse width equal to a desired signal characteristic. The method also includes generating a first analog bias voltage in response to a difference between the first transition time pulse width and the reference pulse width, and biasing a first pre-driver current source with the first analog bias voltage.

An apparatus for locking output transition timing of interface circuitry, according to an aspect of the present disclosure, includes means for generating a first transition time pulse having a pulse width equal to a characteristic of an output driver output and means for generating a reference pulse having a pulse width equal to a desired signal characteristic. The apparatus also includes means for generating a first analog bias voltage in response to a difference between the first transition time pulse width and the reference pulse width and means for biasing a first pre-driver current source with the first analog bias voltage.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided, for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout.

DETAILED DESCRIPTION

Figure 1A:
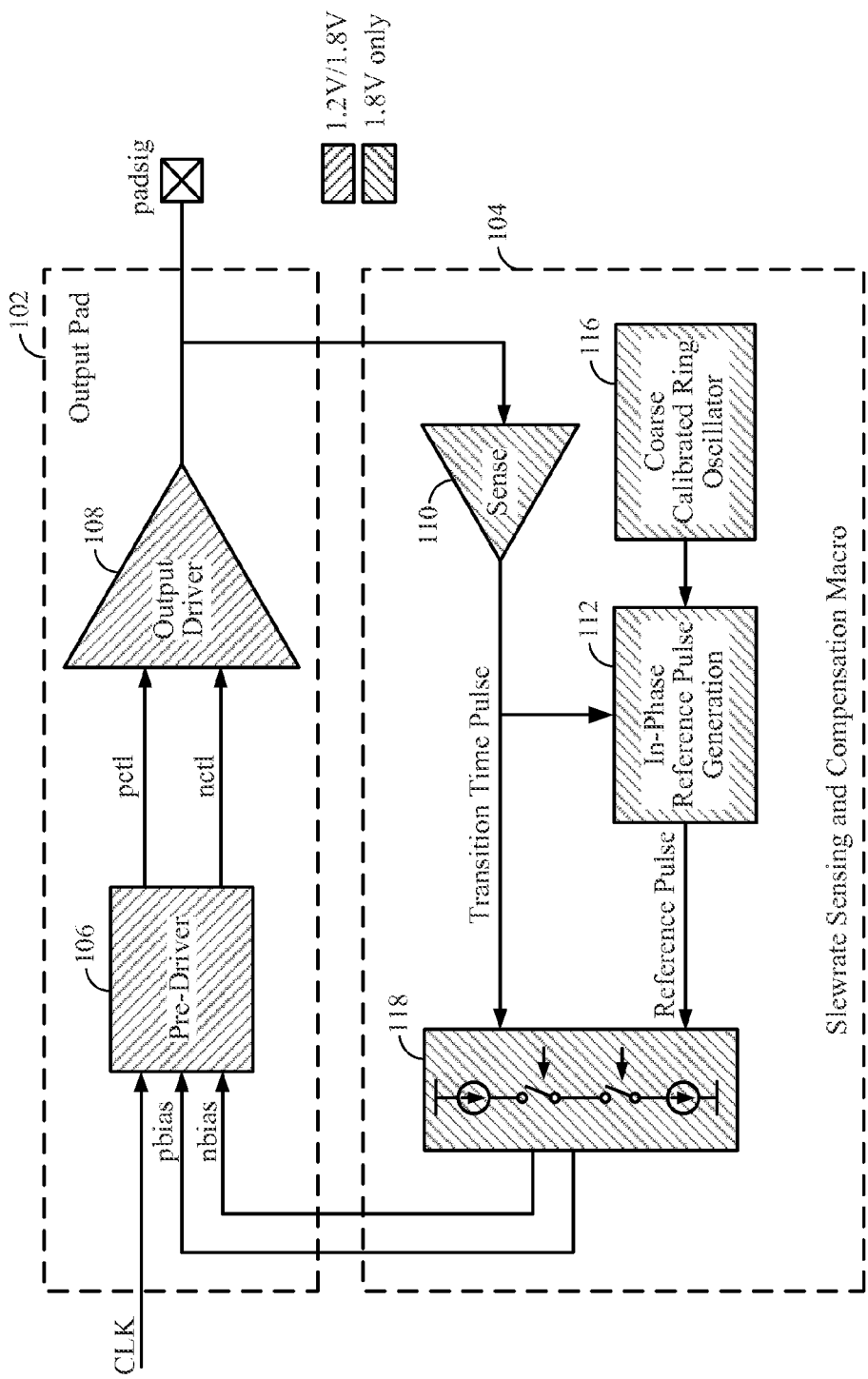
FIG. 1A is a schematic diagram conceptually illustrating a general example of interface circuitry according to aspects of the present disclosure.

FIG. 1A shows a top level block diagram of a design architecture including circuitry 100 for locking output transition time according to aspects of the present disclosure. The circuitry 100 includes output pad circuitry 102 and slew rate sensing and compensation circuitry 104. According to aspects of the present disclosure, the output pad circuitry 102 is configured to support multiple output voltage domains. The output pad circuitry 102 includes a pre-driver 106 coupled to an output driver 108.

According to aspects of the present disclosure, slew rate sensing and compensation circuitry 104 is coupled in a feedback loop from an output node of the output driver 108 to inputs of the pre-driver 106. The slew rate sensing and compensation circuitry 104 includes sense circuitry 110 and in-phase reference pulse generation circuitry 112 coupled to bias generating circuitry 114. The slew rate sensing and compensation circuitry 104 also includes coarse calibrated ring oscillator circuitry 116 coupled to the in-phase reference pulse generation circuitry 112.

According to aspects of the present disclosure, two analog voltages (pbias and nbias) are generated by a bias generation circuitry 118 within the slew rate sensing and compensation circuitry 104. The bias generation circuitry 118 provides the voltages to the output pad circuitry 102 in response to input from the sense circuitry 110 and the in-phase reference pulse generation circuitry 112. The output pad circuitry 102 uses the two analog voltages to adjust output transition time towards the target. The two analog voltages (pbias and nbias) are used to bias current sources in the pre-driver 106. The slew rate sensing and compensation circuitry 104 operates at one voltage, e.g., 1.8 V, while the output pad circuitry 102 operates at two different voltages, e.g., 1.2V and 1.8V.

Figure 2:
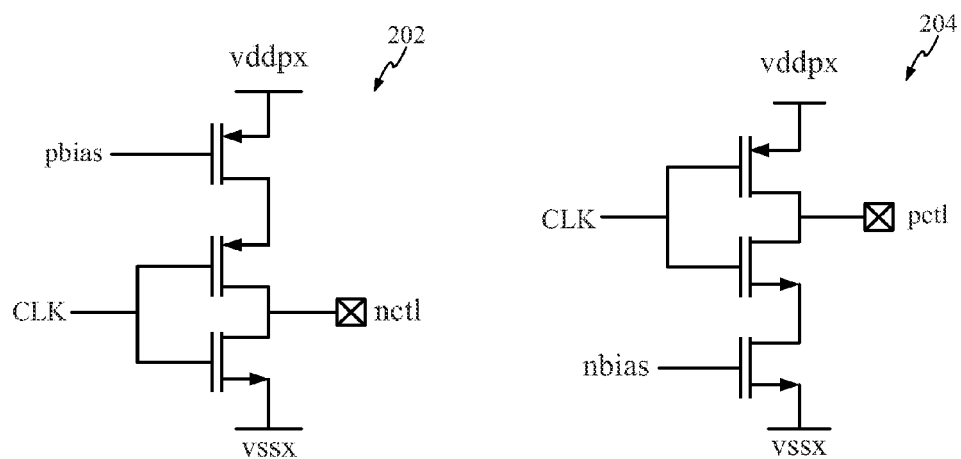
FIG. 2 is schematic diagram conceptually illustrating output pre-driver current source circuitry according to aspects of the present disclosure.

Referring to FIG. 2, one of the analog voltages (pbias) is applied to a first current source 202 and the other analog voltage (nbias) is applied to a second current source 204. The analog voltages control the amount of current in the pre-driver 106. By controlling the amount of current in the pre-driver 106 the slew rate of the pre-driver 106 and the output slew rate are also controlled by the analog voltages pbias and nbias. Further, by biasing current sources in the pre-driver 106 according to aspects of the present disclosure instead of biasing the output driver 108 directly, the use of a stacked output driver design, which could consume up to 75% more area, is avoided.

Figure 3:
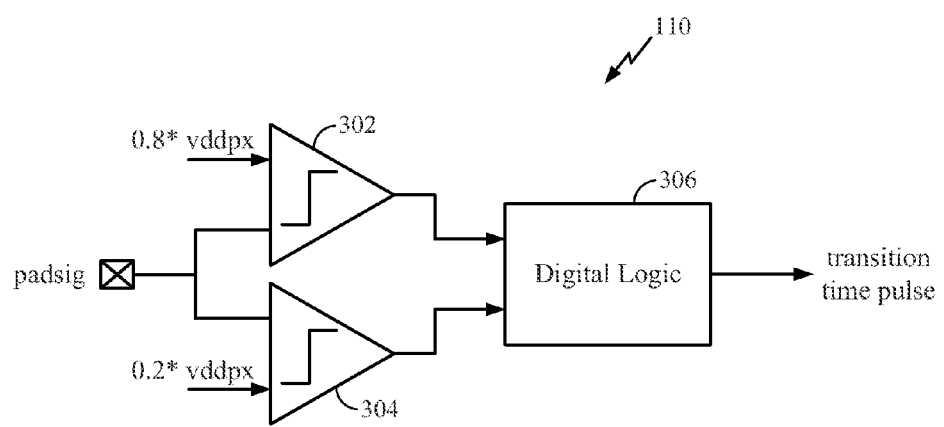
FIG. 3 is schematic diagram conceptually illustrating sensor circuitry according to aspects of the present disclosure

Referring to FIG. 3, exemplary sensor circuitry is described. The sensor circuitry 110 includes a pair of comparators 302, 304 coupled to digital logic circuitry 306. To generate the correct pbias and nbias for the pre-driver, the comparators 302, 304 and digital logic circuitry 306 first sense the current output transition time of the output driver 108 and convert the transition time into a digital pulse. A first reference voltage is applied to a first one of the comparators 302 and a second reference voltage is applied to a second one of the comparators 304. In one example, the first reference voltage is 0.2 times the current source supply voltage (vddpx) and the second reference voltage is 0.8 times the current source supply voltage (vddpx). The first reference voltage and second reference voltage can be generated by a resistor divider.

The comparators 302, 304 compare the present output of the output driver 108 with the reference voltages, and convert the 20%-80% rise time (hereinafter "rise time") of the output and 80%-20% fall time (hereinafter "fall time) of the output into a respective digital pulse with a pulse width that is the same as the corresponding rise time or fall time. According to aspects of the disclosure, such a transition time pulse is generated every time the pad output rises and falls.

Figure 4:
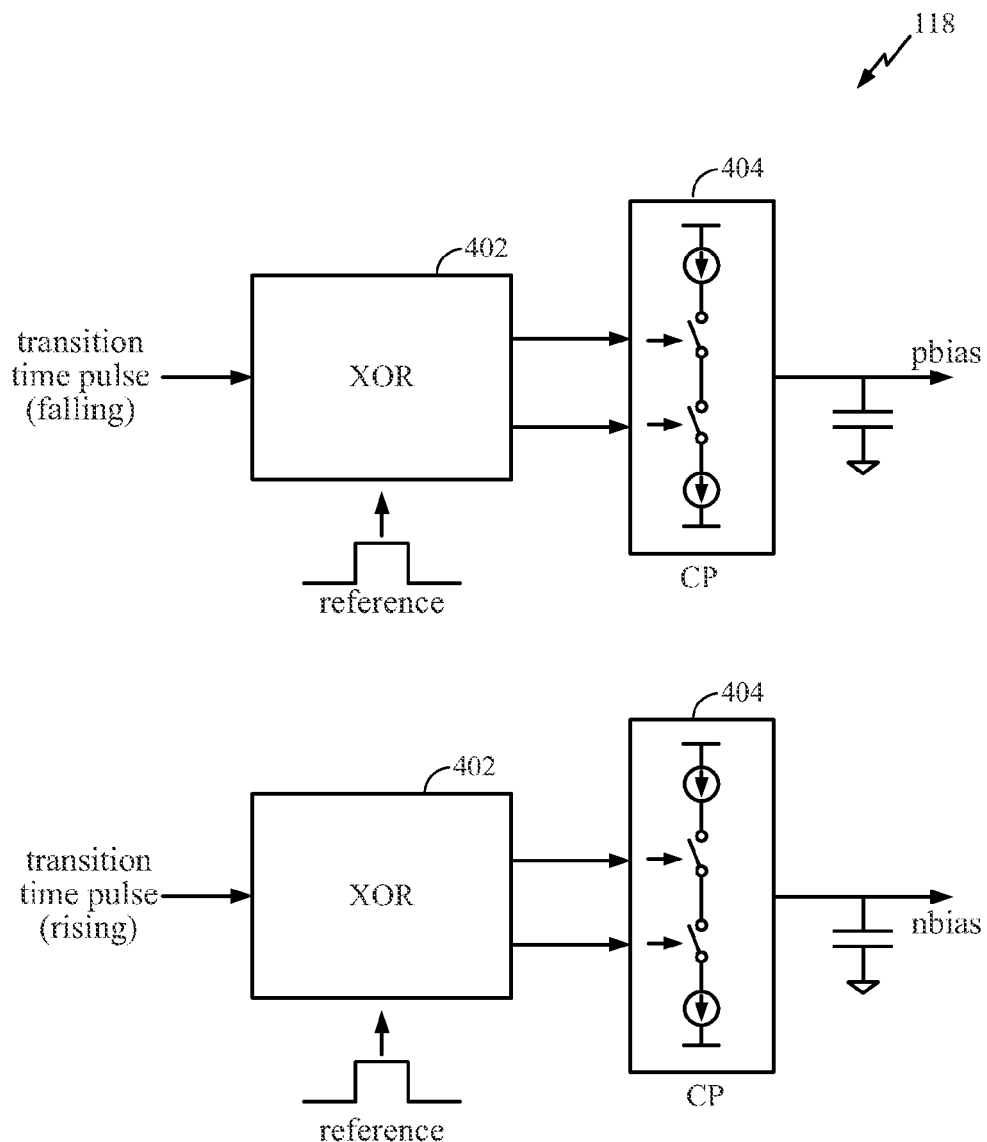
FIG. 4 is a schematic diagram conceptually illustrating a general example of bias generating circuitry according to aspects of the present disclosure.

Referring to FIG. 4, exemplary bias generation circuitry is described. In the bias generation circuitry 118, the transition time pulse is compared with a reference pulse having a pulse width equal to the desired rise/fall time. According to aspects of the disclosure, comparison of the transition time pulse and the reference pulse is performed by XOR circuitry 402.

The bias generating circuitry 118 includes a charge pump 404 coupled to the XOR circuitry 402. The charge pump circuitry 404 adjusts one of the analog bias voltages for the pre-driver 106, i.e., either pbias or nbias, based on the output of the XOR circuitry 402 until the transition time pulse has the same pulse width as the reference pulse. This condition occurs when the output transition time at padsig is the same as the pulse width of the reference pulse. For transition time pulses corresponding to a fall time of the output, the charge pump circuitry 404 adjusts the pbias analog voltage. For transition time pulses corresponding to a rise time of the output, the charge pump circuitry 404 adjusts the nbias analog voltage.

Figure 5:
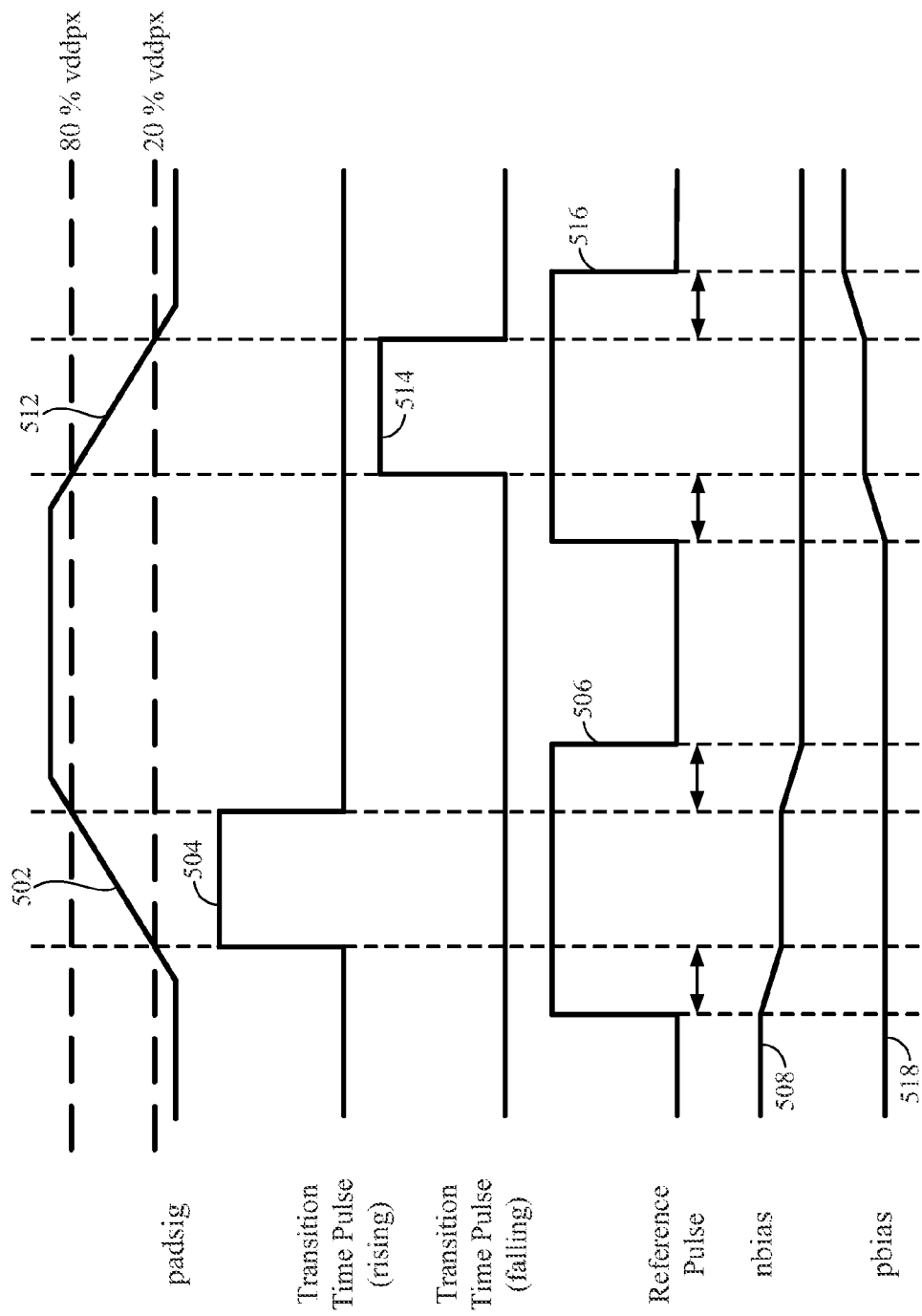
FIG. 5 is a signal timing diagram conceptually illustrating the operation of bias generating circuitry according to aspects of the present disclosure.

The operation of the bias generation circuitry 118 is further described with reference to FIG. 5. During a rising output 502 from the output driver 108, a transition time pulse 504 is generated by the sense circuitry 110. The width of the transition time pulse 504 corresponds to the rise time of the output from 20% of the supply voltage (vddpx) to 80% of the supply voltage (vddpx) (using the exemplary 20% and 80% voltages described above). The pulse width of the transition time pulse 504 is independent of the supply voltage (vddpx). In response to the difference between the width of the transition time pulse 504 and the width of a reference pulse 506, the nbias analog voltage 508 is adjusted.

During a falling output 512 from the output driver 108, a transition time pulse 514 is generated by the sense circuitry 110. The width of the transition time pulse 514 corresponds to the fall time of the output from 80% of the supply voltage (vddpx) to 20% of the supply voltage (vddpx) (again using the exemplary 20% and 80% voltages described above). In response to the difference between the width of the transition time pulse 514 and the width of a reference pulse 516, the pbias analog voltage 518 is adjusted. In this example, the rise/fall time was too fast so the analog bias voltages, pbias and nbias, are adjusted to increase the rise/fail time in the next transition.

Aspects of the present disclosure include circuitry for generating the reference pulse that has a pulse width equal to the desired rise/fall time. A predefined clock reference is not suitable for providing the reference pulse according to the present disclosure because a predefined clock would not follow the operation frequency of the output and would not provide a pulse whenever a rise or fall of the output occurs. In addition, even if the frequency of a predefined clock reference could be adjusted to follow the output frequency, the clock pulse reference may not be in phase with the transition time pulse and may cause a glitch which could severely impact the final locked output transition time.

According to aspects of the present disclosure, the reference pulse is generated based on the actual rise/fall time of the output using ring oscillator circuitry 116. The ring oscillator circuitry 116 is suitable for use in the disclosed architecture because the in-phase reference pulse generation circuitry 112 does not rely on a highly accurate oscillation frequency. For example, a suitable reference pulse can be generated using ring oscillator circuitry 116 as long as the pulse width of the ring oscillator circuitry outputs is within the transition time targets. In accordance with SLIMBus standards, for example, the transition time targets are 3.0 ns-5.3 ns so oscillation frequencies in the range of 95 MHz-167 MHz may be used to generate the reference pulses. A coarse delay calibration can calibrate the ring oscillator circuitry to achieve the targeted frequency range across process corners.

Figure 1B:
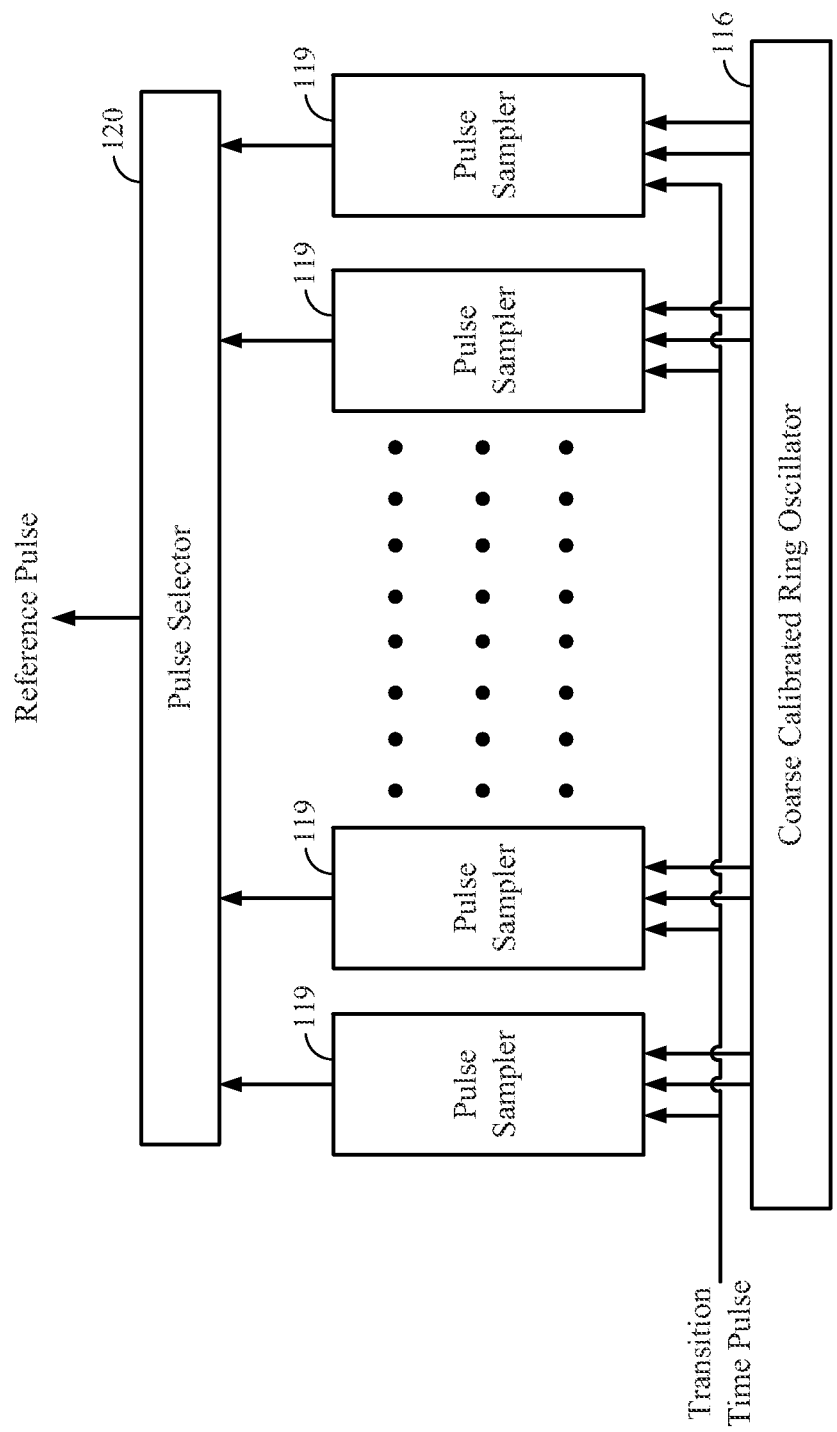
FIG. 1B is a schematic diagram conceptually illustrating a general example of reference pulse generation circuitry according to aspects of the present disclosure.

A more detailed block diagram of the in-phase reference pulse generation circuitry 112 is now described with reference to FIGS. 1A and 1B. The in-phase reference pulse generation circuitry 112 includes a set of pulse samplers 119 coupled to the ring oscillator circuitry 116. Each pair of consecutive outputs from the ring oscillator circuitry 116 is connected to one of the pulse samplers 119. In addition, each of the pulse samplers 119 also receives a transition time pulse from the sensing circuitry 110, According to aspects of the present disclosure, each pulse sampler 119 can individually determine whether to generate a reference pulse based on the pair of consecutive outputs from the ring oscillator circuitry 116 and the transition time pulse from the sensing circuitry 110. In one aspect of the disclosure, a sufficient number of the pulse samplers 119 can be provided to cover all the outputs from the ring oscillator (phase of $2\pi$). In this aspect, only one pulse sampler 119 is activated at a time to generate reference pulse. The pulse selector circuitry 120 selects the activated pulse sampler 119 and feeds the reference pulse to the bias generating circuitry 118.

Figure 6:
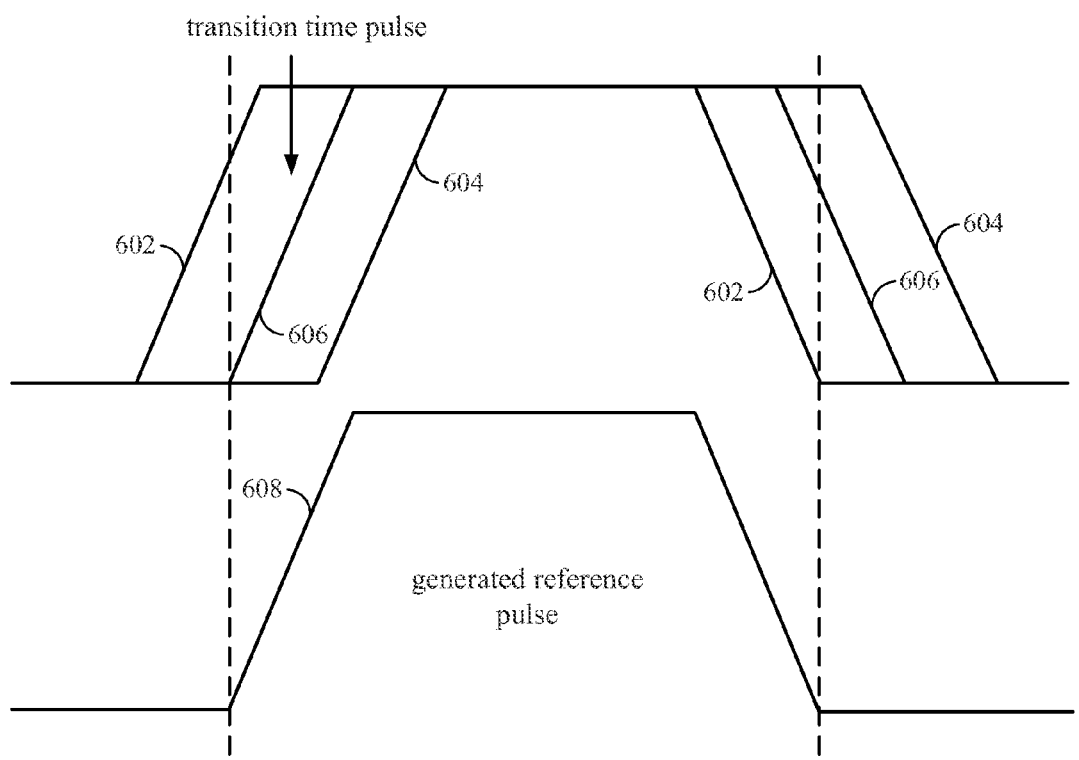
FIG. 6 is schematic diagram conceptually illustrating timing according to aspects of the present disclosure

A method of generating the reference pulse using ring oscillator circuitry 116 according to aspects of the present disclosure is described with reference to FIG. 6. Ring oscillator circuitry 116 provides a first phase output 602 and consecutively provides a second phase output 604. If the transition time pulse 606 occurs between the first phase output 602 and the second phase output 604, generation of a reference pulse is triggered. The rising edge of the transition time pulse 606 is used as the rising edge of the reference pulse 608 and the falling edge of the first phase output 602 from the ring oscillator circuitry 116 is used as the falling edge of the reference pulse. This process is repeated to generate anew reference pulse for every rise and fall at the pad output. The generated reference pulse has a slightly smaller pulse width than the ring oscillator output, but it is acceptably accurate for implementing the transition time lock loop architecture of the present disclosure. For implementation in which increased accuracy is desired, additional delay stages can be added to the ring oscillator circuitry 116 to reduce the delay between the first phase output 602 and the second phase output 604.

Figure 7:
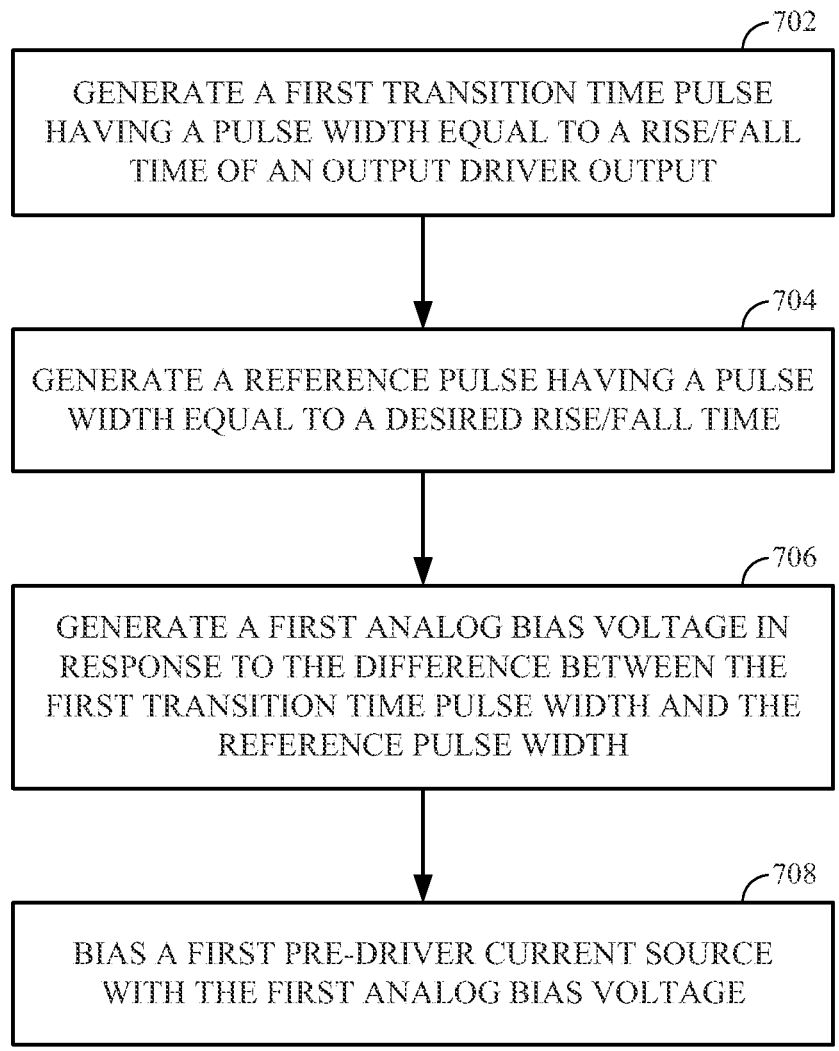
FIG. 7 is a process flow diagram illustrating a reference pulse generating technique according to an aspect of the present disclosure.

A method for locking output transition time of interface circuitry according to an aspect of the present disclosure is described with reference to FIG. 7. In block 702, a first transition time pulse having a pulse width equal to a rise/fall time of an output driver output is generated. In block 704, a reference pulse having a pulse width equal to a desired rise/fall time is generated. In block 706, a first analog bias voltage is generated in response to a difference between the first transition time pulse width and the reference pulse width. In block 708, a first pre-driver current source is biased with the first analog bias voltage.

In one configuration, an apparatus for locking output transition timing of interface circuitry includes means for generating a first transition time pulse. The means for generating a first transition time pulse may be the sensor circuitry 110, for example. The apparatus may include means, such as the in-phase reference pulse generation circuitry 112, for generating a reference pulse. The apparatus may also include means, for example the bias generation circuitry 118, for generating a first analog bias voltage. The apparatus may also have means for biasing a first pre-driver current source. In one configuration, the biasing means may be the pre-driver 106. In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 8:
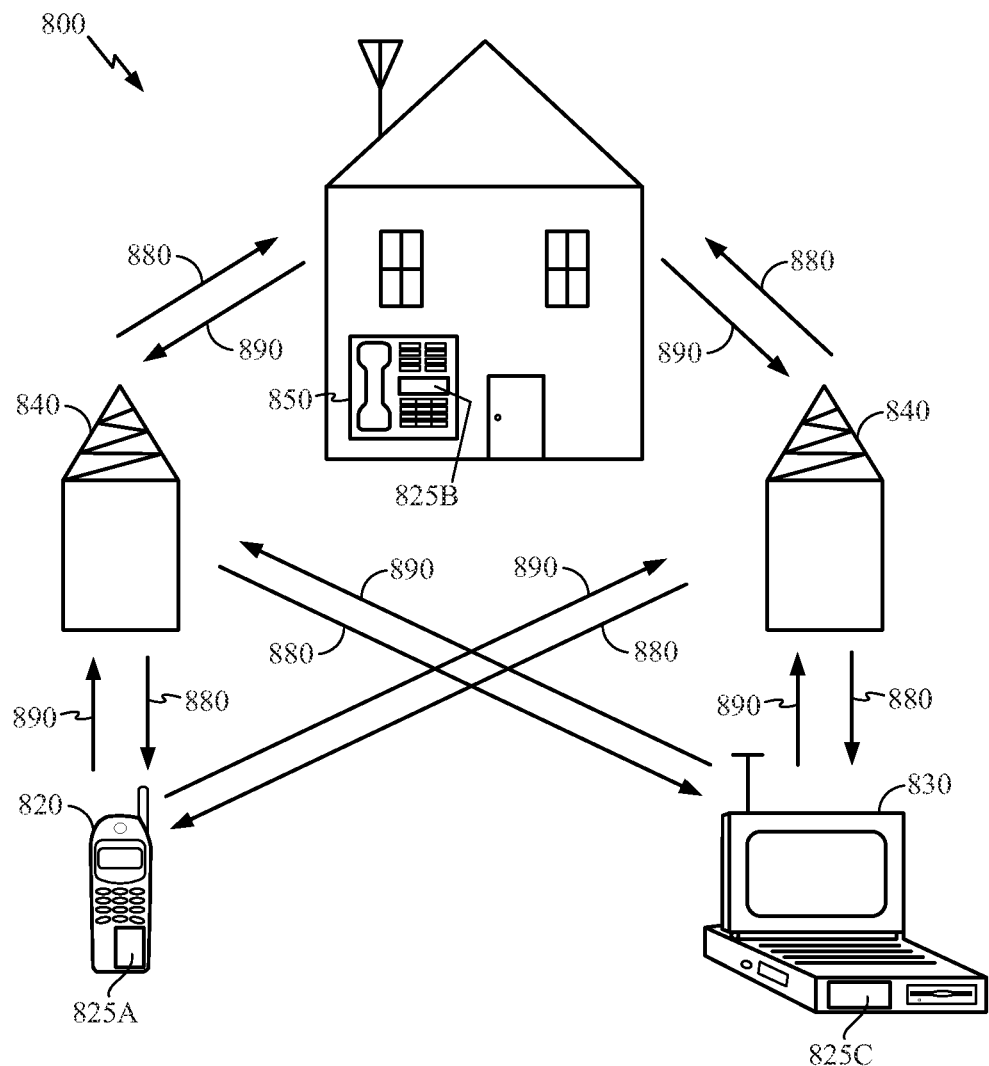
FIG. 8 shows an exemplary wireless communication system in which a configuration of the disclosure may be advantageously employed.

FIG. 8 shows an exemplary wireless communication system 800 in which a configuration of the disclosed calibration method may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include the timing locking circuitry 825A, 825B, and 825C, respectively. FIG. 8 shows forward link signals 880 from the base stations 840 and the remote units 820, 830, and 850 and reverse link signals 890 from the remote units 820, 830, and 850 to base stations 840.

In FIG. 8, the remote unit 820 is shown as a mobile telephone, remote unit 830 is shown as a portable computer, and remote unit 850 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 8 illustrates remote units, which may employ timing locking circuitry according to the teachings of the disclosure, the disclosure is not limited to these exemplary illustrated units. For instance, timing locking circuitry according to configurations of the present disclosure may be suitably employed in any device.

Figure 9:
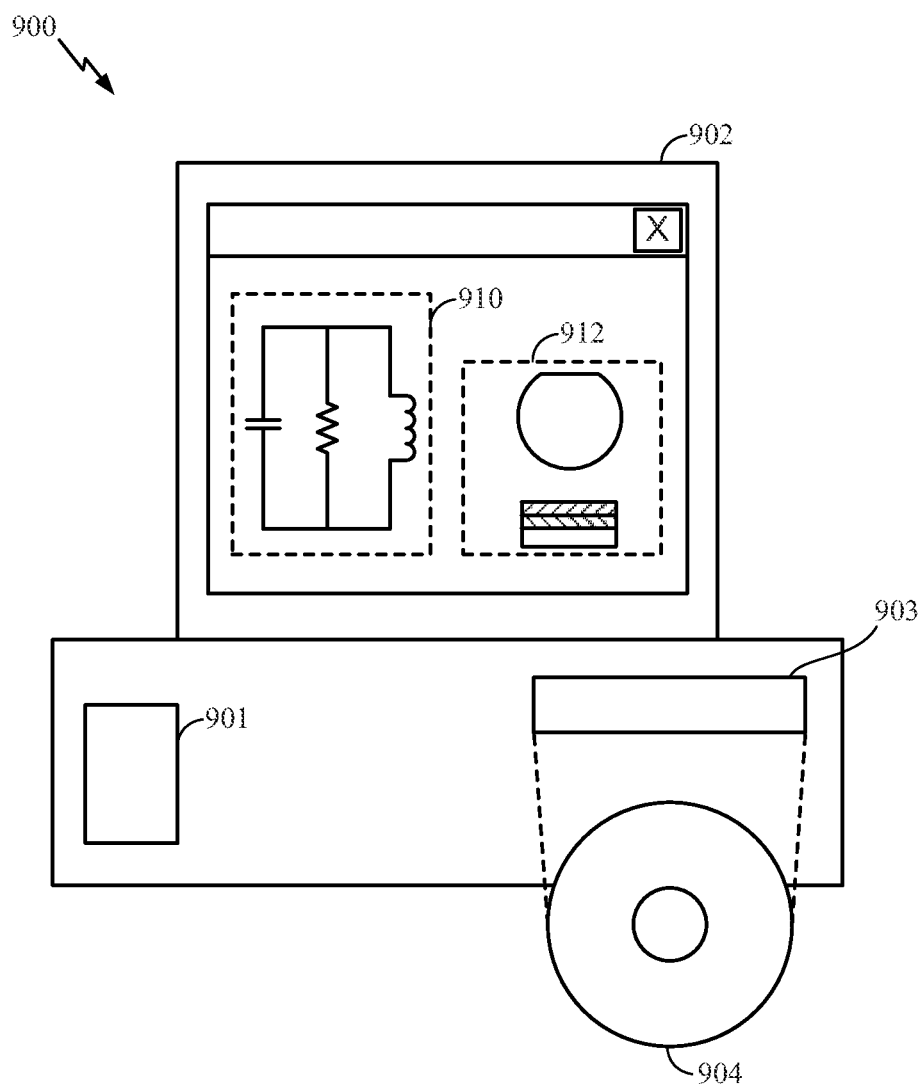
FIG. 9 is a block diagram illustrating a design workstation for circuit, layout, and logic design of a semiconductor component according to one aspect of the present disclosure.

FIG. 9 is a block diagram illustrating a design workstation used for circuit, layout, and logic design of a semiconductor component, such as the timing locking circuitry disclosed above. A design workstation 900 includes a hard disk 901 containing operating system software, support files, and design software such as Cadence or OrCAD. The design workstation 900 also includes a display 902 to facilitate design of a circuit 910 or a semiconductor component 912 such as the timing locking circuitry. A storage medium 904 is provided for tangibly storing the circuit design 910 or the semiconductor component 912. The circuit design 910 or the semiconductor component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit design 910 or the semiconductor component 912 by decreasing the number of processes for designing semiconductor wafers.

Although specific circuitry has been set forth, it will be appreciated by those skilled in the art that not all of the disclosed circuitry is required to practice the disclosed configurations. Moreover, certain well known circuits have not been described, to maintain focus on the disclosure.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular configurations of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An output driver time lock loop apparatus comprising:
   output driver circuitry coupled between a first output node and a second output node; and
   feedback circuitry coupled to the output driver circuitry, the feedback circuitry configured to generate a first analog bias voltage in response to a signal on the second output node, the feedback circuitry comprising:
      sensing circuitry coupled to the second output node, the sensing circuitry configured to sense a first characteristic of the signal on the second output node;
      reference pulse generation circuitry configured to generate a reference pulse having a pulse width equal to a desired signal characteristic, the reference pulse generation circuitry comprising a chain of inverting stages configured as a ring oscillator, a plurality of pulse samplers coupled to the ring oscillator, each of the pulse samplers configured to receive the transition time pulse and to receive input from a pair of consecutive inverting stages in the chain of inverting stages, each pulse sampler configured to trigger generation of the reference pulse when a rising edge of the transition time pulse is received between the input from the pair of consecutive inverting stages, and charge pump circuitry coupled to the sensing circuitry and coupled to the reference pulse generation circuitry, the charge pump circuitry configured to generate the first analog bias voltage in response to the first characteristic and the reference pulse;
   the output driver circuitry including a first current source biased by the first analog bias voltage.

2. The output driver time lock loop apparatus of claim 1, in which the feedback circuitry generates the first analog bias voltage in response to a fall time of the signal.

3. The output driver time lock loop apparatus of claim 2, in which the feedback circuitry is further configured to generate a second analog bias voltage in response to a rise time of the signal on the second output node,
   the output driver circuitry further including a second current source biased by the second analog bias voltage.

4. The output driver time lock loop apparatus of claim 1, in which the sensing circuitry further comprises:
   a first comparator configured for comparing the signal on the second output node with a high threshold voltage to generate a high signal voltage indication;
   a second comparator configured for comparing the signal on the second output node with a low threshold voltage to generate a low signal voltage indication; and
   digital logic circuitry coupled to an output of the first comparator and an output of the second comparator, the digital logic circuitry configured to output a transition time pulse having a width equal to a rise time between the low signal voltage indication and the high signal voltage indication when the signal on the second output node is rising and having a pulse width equal to a fall time between the high signal voltage indication and the low signal voltage indication when the signal on the second output node is falling.

5. The output driver time lock loop apparatus of claim 1, integrated in at least one of a mobile phone, a set top box, a music player, a video player, an entertainment unit, a navigation device, a computer, a hand-held personal communication systems (PCS) unit, a portable data unit, and a fixed location data unit.

6. A method for locking output transition timing of interface circuitry, comprising:
generating a first transition time pulse having a pulse width equal to a characteristic of an output driver output;
generating a reference pulse having a pulse width equal to a desired signal characteristic by:
comparing timing of a pair of consecutive ring oscillator stages with timing of the first transition time pulse;
generating a rising edge of the reference pulse when a rising edge of the first transition time pulse occurs between an input from the pair of consecutive ring oscillator stages; and
generating a falling edge of the reference pulse when a next falling edge occurs on the pair of consecutive ring oscillator stages;
generating a first analog bias voltage in response to a difference between a first transition time pulse width and the reference pulse width;
biasing a first pre-driver current source with the first analog bias voltage;
generating a second transition time pulse having a pulse width equal to a fall time of the output driver output;
generating a second analog bias voltage in response to a difference between a second transition time pulse width and the reference pulse width; and
biasing a second pre-driver current source with the second analog bias voltage.

7. The method of claim 6, in which the characteristic of the output driver output comprises a rise time.

8. The method of claim 6, further comprising:
comparing the output driver output with a high threshold voltage to generate a high signal voltage indication;
comparing the output driver output with a low threshold voltage to generate a low signal voltage indication;
generating the first transition time pulse when the output driver output is rising between the low signal voltage indication and the high signal voltage indication; and
generating the second transition time pulse when the output driver output is falling between the high signal voltage indication and the low signal voltage indication.

9. The method of claim 6, further comprising integrating the interface circuitry into at least one of a mobile phone, a set top box, a music player, a video player, an entertainment unit, a navigation device, a computer, a hand-held personal communication systems (PCS) unit, a portable data unit, and a fixed location data unit.

10. An apparatus for locking output transition timing of interface circuitry, comprising:
means for generating a first transition time pulse having a pulse width equal to a characteristic of an output driver output;
means for generating a reference pulse having a pulse width equal to a desired signal characteristic, the means for generating the reference pulse comprising:
means for comparing timing of a pair of consecutive ring oscillator stages with timing of the first transition time pulse;
means for generating a rising edge of the reference pulse when a rising edge of the first transition time pulse occurs between an input from the pair of consecutive ring oscillator stages; and
means for generating a falling edge of the reference pulse when a next falling edge occurs on the pair of consecutive ring oscillator stages;
means for generating a first analog bias voltage in response to a difference between a first transition time pulse width and the reference pulse width;
means for biasing a first pre-driver current source with the first analog bias voltage,
means for generating a second transition time pulse having a pulse width equal to a fall time of the output driver output;
means for generating a second analog bias voltage in response to a difference between a second transition time pulse width and the reference pulse width; and
means for biasing a second pre-driver current source with the second analog bias voltage.

11. The apparatus of claim 10, in which the characteristic of the output driver output comprises a rise time.

12. The apparatus of claim 10, integrated into at least one of a mobile phone, a set top box, a music player, a video player, an entertainment unit, a navigation device, a computer, a hand-held personal communication systems (PCS) unit, a portable data unit, and a fixed location data unit.

13. A method for locking output transition timing of interface circuitry, comprising the steps of:
generating a first transition time pulse having a pulse width equal to a characteristic of an output driver output;
generating a reference pulse having a pulse width equal to a desired signal characteristic by:
comparing timing of a pair of consecutive ring oscillator stages with timing of the first transition time pulse;
generating a rising edge of the reference pulse when a rising edge of the first transition time pulse occurs between an input from the air of consecutive ring oscillator stages; and
generating a falling edge of the reference pulse when a next falling edge occurs on the pair of consecutive ring oscillator stages;
generating a first analog bias voltage in response to a difference between a first transition time pulse width and the reference pulse width;
biasing a first pre-driver current source with the first analog bias voltage;
generating a second transition time pulse having a pulse width equal to a fall time of the output driver output;
generating a second analog bias voltage in response to a difference between a second transition time pulse width and the reference pulse width; and
biasing a second pre-driver current source with the second analog bias voltage.

14. The method of claim 13, further comprising the step of integrating the interface circuitry into at least one of a mobile phone, a set top box, a music player, a video player, an entertainment unit, a navigation device, a computer, a hand-held personal communication systems (PCS) unit, a portable data unit, and a fixed location data unit.

* * * * *